(12) United States Patent
Kinzer

(10) Patent No.: US 6,433,396 B1
(45) Date of Patent: Aug. 13, 2002

(54) TRENCH MOSFET WITH INTEGRATED SCHOTTKY DEVICE AND PROCESS FOR ITS MANUFACTURE

(75) Inventor: Daniel M. Kinzer, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 51 days.

(21) Appl. No.: 09/679,007

(22) Filed: Oct. 4, 2000

Related U.S. Application Data

(60) Provisional application No. 60/157,740, filed on Oct. 5, 1999.

(51) Int. Cl.$^7$ .................. H01L 29/94; H01L 31/062
(52) U.S. Cl. ........................ 257/369; 257/368
(58) Field of Search .................. 257/365, 369, 257/334, 663

(56) References Cited

U.S. PATENT DOCUMENTS 6,078,090 A * 6/2000 Williams et al.

FOREIGN PATENT DOCUMENTS

EP            348916      * 1/1990

* cited by examiner

*Primary Examiner*—Stephen D. Meier
(74) *Attorney, Agent, or Firm*—Ostrolenk, Faber, Gerb & Soffen, LLP

(57) ABSTRACT

A trench type MOSgated device and a planar Schottky diode are integrated with the same chip or die and are inherently connected in parallel, sharing a common drain/cathode and a common source/anode. The mixture of a planar Schottky with a trench MOSgated device enables a simpler manufacturing process than that needed to make both devices with trench technology.

15 Claims, 3 Drawing Sheets

TRENCH MOSFET WITH INTEGRATED SCHOTTKY DEVICE AND PROCESS FOR ITS MANUFACTURE

RELATED APPLICATIONS

This application is related to and claims the benefit of the filing date of Oct. 5, 1999 of provisional application Ser. No. 60/157,740, filed Oct. 5, 1999.

FIELD OF THE INVENTION

This invention relates to an integrated trench type MOSFET and a Schottky diode and a novel process for its manufacture.

BACKGROUND OF THE INVENTION

Integrated MOSFET and Schottky diode structures are well known. When these devices are made with a trench process, both the MOSFET and diode are made with trench structure. The process for making such a device becomes complicated because of the complicated silicon etch and contact sequence. It would be desirable to provide a structure and process for the manufacture of an integrated MOSFET and Schottky diode which requires fewer mask steps than those needed for the integration of a trench MOSFET and trench diode.

BRIEF DESCRIPTION OF THE INVENTION

In accordance with the invention, an integrated structure is provided, using alternating sections of a trench type MOSFET and a planar type of Schottky diode. Thus, the trench type Schottky manufacturing steps required in the prior art are avoided to simplify the device structure and process.

DETAILED DESCRIPTION OF THE DRAWINGS

Figure 1:
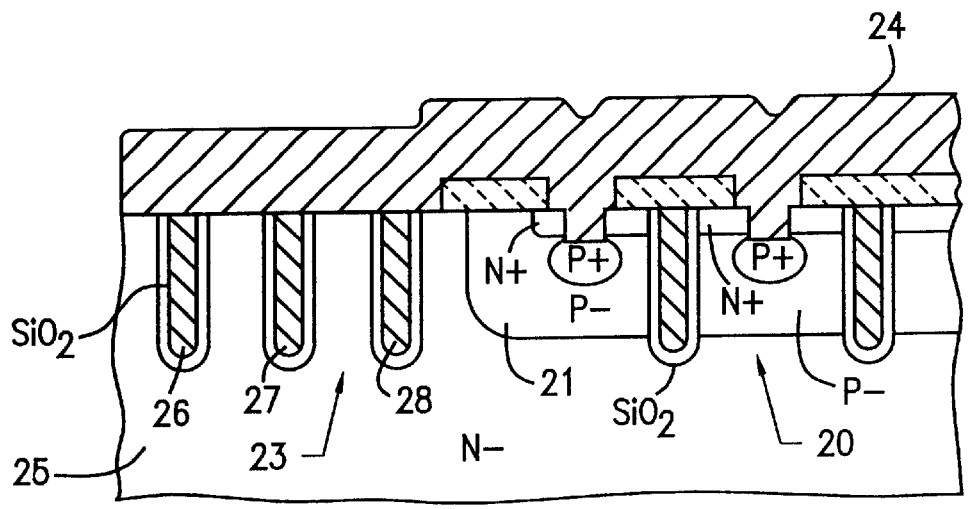
FIG. 1 is a cross-sectional view through a tiny portion of a prior art wafer or chip of silicon containing an integrated MOSFET and Schottky diode, both of the trench type.
Figure 2:
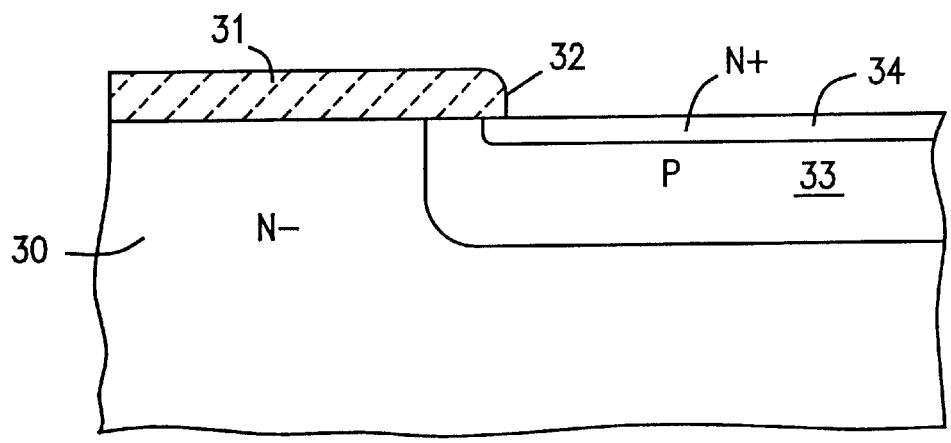
FIG. 2 shows a small portion of a chip, like that of FIG. 1, for a first embodiment of the invention, at the process step of the first active mask.

Referring first to FIG. 1, there is shown an integrated MOSFET and Schottky diode, both of which have been made by a trench process. Thus, a trench-type MOSFET structure 20 is formed in a P⁻ diffusion well 21, while a trench type Schottky diode structure 23 is formed by the contact of aluminum source electrode 24 to the top surfaces of the N⁻ silicon body 25 between trenches 26, 27, 28. The aluminum source contact also makes contact to the N⁺ sources and P⁺ diffusions in P⁺ body to act as the source electrode of the MOSFET elements. A drain electrode (not shown) is connected to the bottom of the chips or die in the usual fashion.

The manufacture of the device of FIG. 1 is complicated by the necessary silicon etches in the contact sequence. It also requires extra masks to prevent source and body diffusions in the Schottky area. In accordance with the invention, a novel process and structure is created in which only the MOSFET is made by a trench process and a planar Schottky diode is integrated therein with a minimum number of mask steps.

FIGS. 2 through 6 show the process flow of the present invention for a small segment of the top region of a chip. Thus, in FIG. 2, an N⁻ body region 30 which may be epitaxially grown atop an N⁺ wafer (not shown) receives a silicon dioxide layer 31. A first and active mask step is then carried out, opening a window 32 in layer 31. A P region 33 is then implanted and diffused into the opened area, forming the body or channel diffusion 33. An N⁺ diffusion 34, which is a source diffusion, is next formed.

Figure 3:
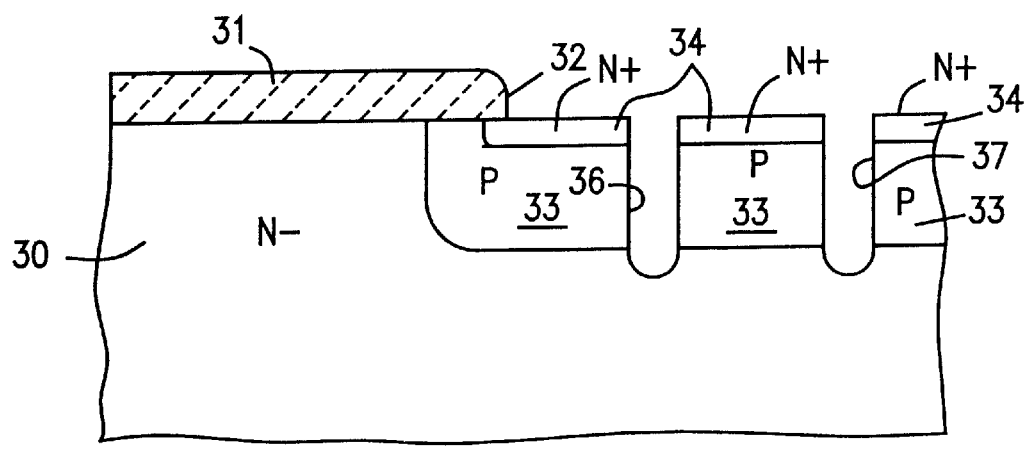
FIG. 3 shows the structure of FIG. 2 after a second mask step and the formation of trenches for the MOSFET structure only.
Figure 4:
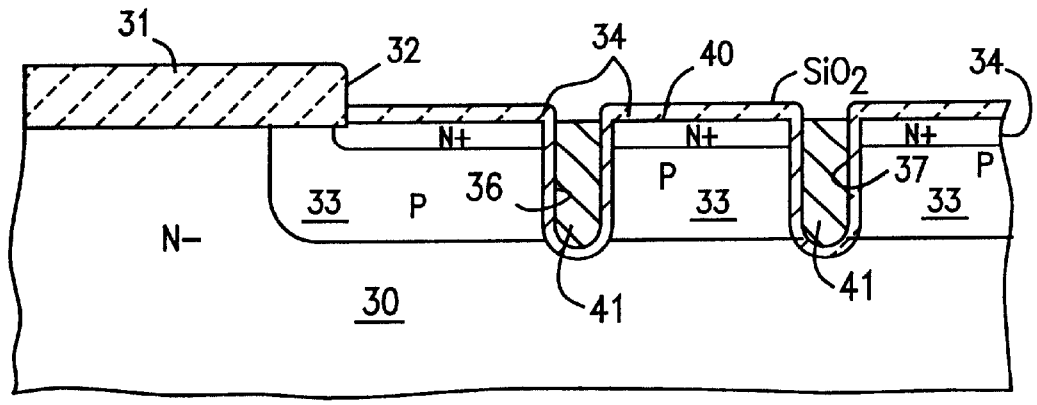
FIG. 4 shows the structure of FIG. 3 after the deposition of polysilicon and a polysilicon mask and etch step.

In a second mask step, shown in FIG. 3, a trench step is carried out to define a plurality of spaced trenches such as trenches 36, 37 through the N⁺ region 34 and P region 33, reaching the underlying N⁻ body 30.

A silicon dioxide layer 40 (FIG. 4) is next grown over the exposed silicon surfaces in the trenches 36, 37, forming the gate oxide, and atop the silicon spanning the trenches. A conductive polysilicon layer 41 is then grown over the full exposed top surface of the chip and into the trenches 36 and 37. Using a third mask step, a polysilicon mask is used in which the polysilicon layer 40 outside of the trenches (not shown) is etched away. Silicon dioxide is then grown or deposited over the exposed top surface, to cover the tops of the conductive polysilicon with thickened insulation regions atop the polysilicon filled trench areas.

Figure 5:
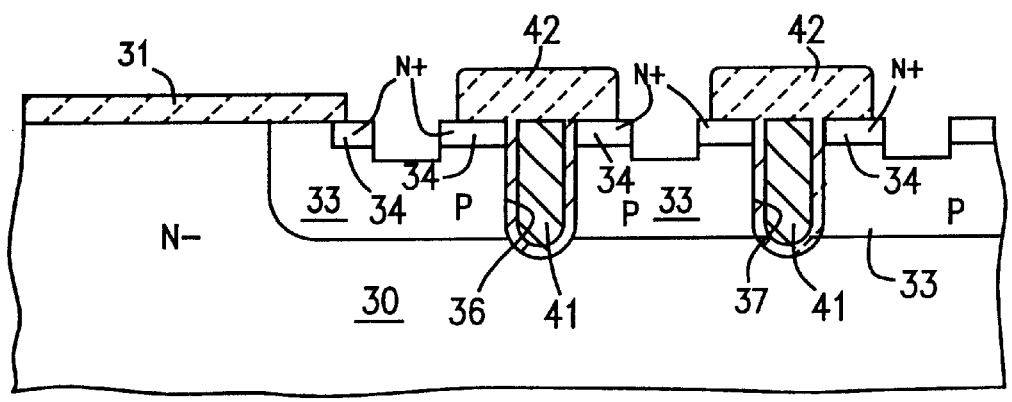
FIG. 5 shows the structure of FIG. 4 after an oxide deposition and a contact mask step.
Figure 6:
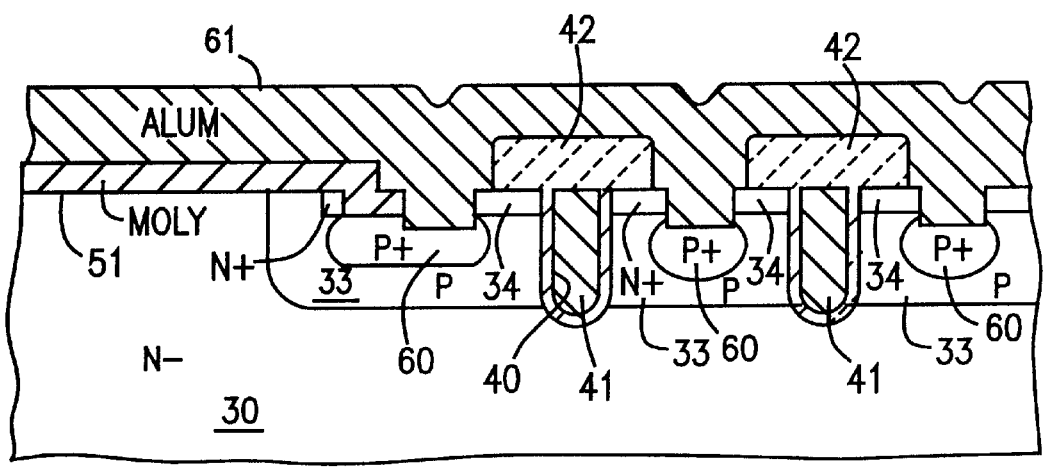
FIG. 6 shows the structure of FIG. 5 after the formation of a Schottky contact; a Schottky contact mask and etch; and the deposition of an aluminum contact.

The next process step is a fourth contact mask step as shown in FIG. 5, in which the oxide layer 34 is patterned to produce separate regions 42; and central openings are etched through N+regions 34 and into P regions 33. As shown in FIG. 6, P⁺ contact regions 60 are diffused into the bottoms of the etched contact wells. Following this step a portion of the field oxide layer 31 remaining over N⁻ silicon 30 is etched off in a fifth Schottky contact mask step.

Thereafter, a molybdenum layer 51, or other Schottky-forming metal is deposited atop the chip or wafer and onto region 30. As further shown in FIG. 6, a sixth molybdenum mask step is carried out to control the extent of the edge of the molybdenum contact 51 into the area of the contact well 33 and in contact with P⁺ diffusion 60 and N⁺ source diffusion 34.

Finally, and as shown in FIG. 6, an source layer 61 of aluminum is deposited atop the surface of the chip. In a seventh mask step, which is the aluminum mask step, the aluminum source contact layer is suitably patterned (at termination regions and the like, not shown).

The polysilicon regions 41 are connected together to form the MOSFET gate in the usual manner and a drain contact is connected to the bottom of the chip. A planar Schottky contact is formed by the molybdenum layer 51 to N⁻ silicon 30 and may have any desired area relative to the trench type MOSFET. The use of the planar Schottky, instead of a trench Schottky simplifies the mask sequence. No additional source and body masks are required.

Figure 7:
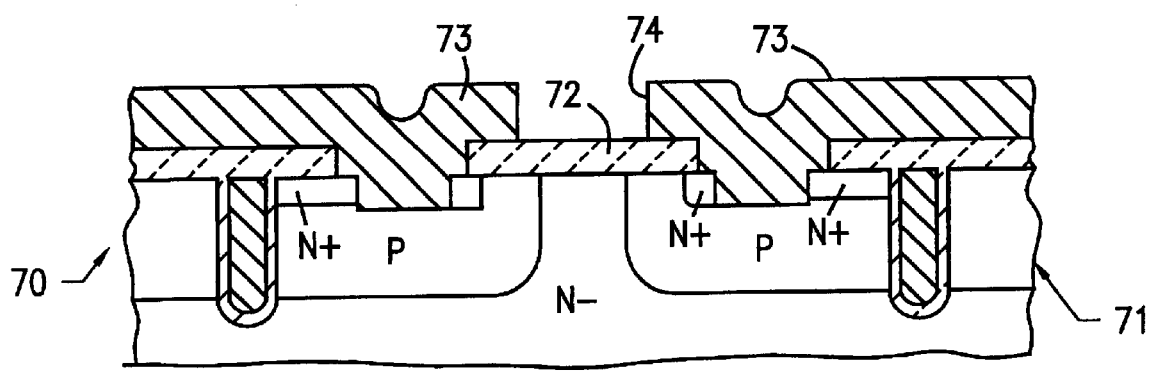
FIG. 7 shows two spaced wafer or chip segments like those of FIG. 6, but with a post aluminum mask step in accordance with a further embodiment of the invention.
Figure 8:
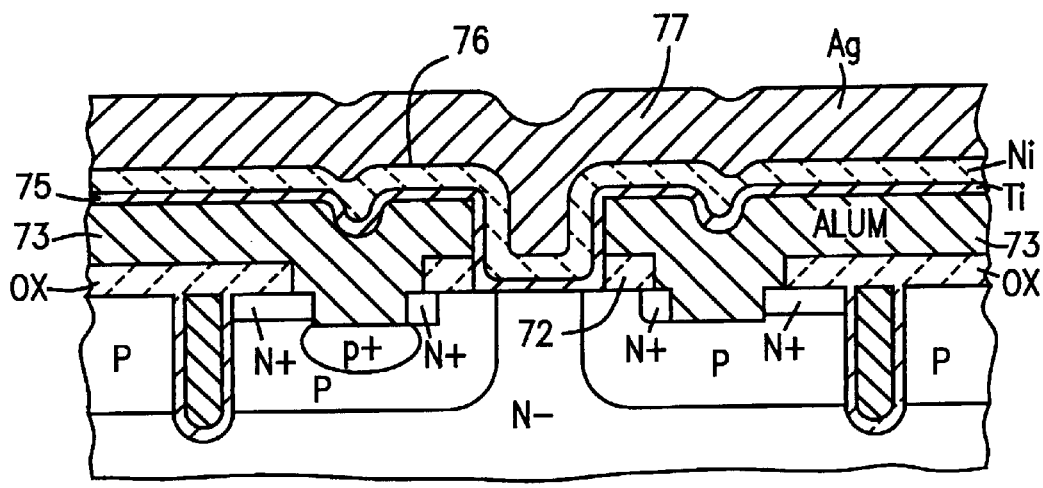
FIG. 8 shows the structure of FIG. 7 after the formation of a silicon nitride layer and the application of a Schottky contact layer.

FIGS. 7 and 8 show a second process flow for forming an integrated planar Schottky diode and trench type MOSFET. Thus, in FIG. 7, the structure shown includes two laterally spaced MOSFET regions 70 and 71 which each have the structure shown at the process step of FIG. 5. The gap between diffusions 70 and 71 is covered by oxide layer 72 which may be likened to oxide layer 31 in FIG. 5. An aluminum source electrode 73 is then deposited atop the silicon and is patterned in a post aluminum mask step to open gap 74.

Thereafter, and as shown in FIG. 8, the top surface of the device may be covered with a nitride (not shown), and a nitride etch and then an oxide etch is used to expose and then remove the field oxide 72 over the N⁻ silicon in gap 74. A titanium layer 75 (or alternative barrier metal) is then deposited over the full upper surface of the wafer, forming a Schottky contact to the N⁻ silicon in gap 74. A nickel layer 76 and silver layer 77 are sputtered atop titanium layer 75 to form the top contact of the device.

Note that the opposing edges of aluminum contact 73 in gap 74 could be pulled back to make alignment and step coverage less critical.

Figure 9:
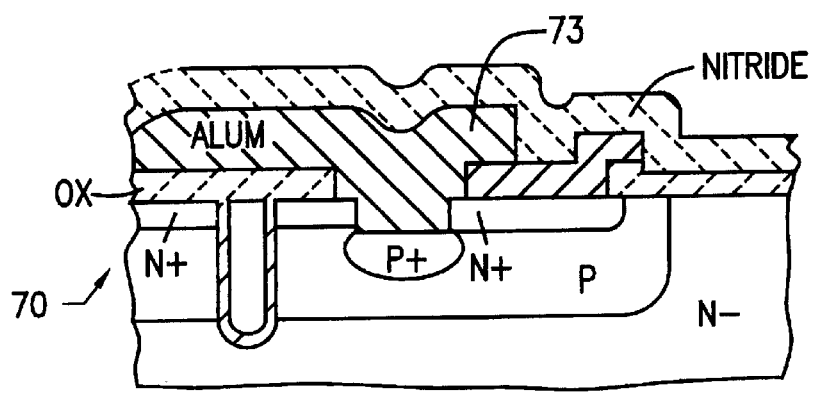
FIG. 9 shows the structure of FIG. 8 in which the aluminum contact is removed from the edge of the contact area.

As shown in FIG. 9, which shows region 70 of FIG. 7, the contact 73 is removed a given distance from the active edge. The next process step will then remove the oxide over the Schottky area after the nitride etch.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A combined MOSgated device and Schottky diode which are integrated into a common silicon die; said die having an upper surface and a lower surface; said upper surface receiving a trench MOSgated device junction pattern in a first area thereof and a planar Schottky diode in a second area thereof which is laterally removed from said first area, said second area being free from any trenches.

2. The device of claim 1, wherein said silicon die has a body of a first conductivity type and an epitaxially deposited silicon layer on top of said body and extending to said upper surface; said junction pattern of said trench MOSgated device being formed substantially fully within said epitaxially deposited layer; said planar Schottky diode being formed by a metal Schottky layer disposed atop said upper surface.

3. The device of claim 1, which includes a first common metal layer contact on said lower surface which services as both the drain electrode of said MOSgated device and the cathode electrode of said Schottky diode.

4. A combined MOSgated device and Schottky diode which are integrated into a common silicon die; said die having an upper surface and a lower surface; said upper surface receiving a trench MOSgated device junction pattern in a first area thereof and a planar Schottky diode in a second area thereof which is laterally removed from said first area, said planar Schottky diode being formed by a metal Schottky layer disposed atop said upper surface, further including a second common metal layer contact extending across said top surface of said die and in contact with selected portions of said junction pattern to serve as a source contact of said MOSgated device, said second common metal layer being in contact with said metal Schottky layer which serves as an anode contact of said Schottky diode.

5. The device of claim 2, which includes a first common metal layer contact on said lower surface which services as both the drain electrode of said MOSgated device and the cathode electrode of said Schottky diode.

6. The device of claim 2, which includes a second common metal layer contact extending across said top surface of said die and in contact with selected portions of said junction pattern to serve as the source contact of said MOSgated device, and in contact with said metal Schottky layer to serve as the anode contact of said Schottky diode.

7. The device of claim 5, which includes a second common metal layer contact extending across said top surface of said die and in contact with selected portions of said junction pattern to serve as the source contact of said MOSgated device, and in contact with said metal Schottky layer to serve as the anode contact of said Schottky diode.

8. The device of claim 6, wherein said second common metal is disposed atop and in contact with said metal Schottky layer.

9. The device of claim 7, wherein said second common metal is disposed atop and in contact with said metal Schottky layer.

10. The device of claim 2, wherein said metal Schottky layer is molybdenum.

11. The device of claim 4, wherein said metal Schottky layer is molybdenum.

12. The device of claim 9, wherein said metal Schottky layer is molybdenum.

13. An integrated MOSgated device and Schottky diode comprising:

a die of monocrystaline silicon of one conductivity type and having a top surface and a bottom surface;

a channel diffusion layer of the other conductivity type formed into a first area of said top surface, a source layer of said one conductivity type formed above said channel diffusion and extending to said first surface;

a plurality of spaced trenches extending through said source layer and said channel diffusion layer and a gate oxide lining the interior walls of said spaced trenches;

a conductive gate material filling the interiors of each of said trenches;

a conductive source electrode disposed on said top surface and in contact with the source layer regions and channel diffusion regions of each of said trenches;

a conductive drain electrode coupled to the body of said die;

a planar Schottky metal layer disposed atop and in contact with the body of said silicon die and extending over a second area of said top surface; said first conductive source electrode extending across and in contact with said Schottky metal layer and serving as the anode contact for the Schottky barrier formed by said Schottky metal;

said conductive drain electrode serving as the cathode contact of a Schottky diode formed by said Schottky metal layer; and a gate electrode connected to said conductive gate material.

14. The device of claim 13, wherein said conductive drain electrode is connected to and across said bottom surface.

15. The device of claim 13, wherein said die comprises a body and an epitaxially deposited layer on top of said body; said epitaxially deposited layer extending to said first surface; said trenches extending fully withing said epitaxially deposited layer.

* * * * *